(12) United States Patent
Chang et al.

(10) Patent No.: US 11,476,125 B2
(45) Date of Patent: Oct. 18, 2022

(54) MULTI-DIE PACKAGE WITH BRIDGE LAYER

(71) Applicant: Taiwan Semiconductor Manufacturing Company, Ltd., Hsinchu (TW)

(72) Inventors: Wei Sen Chang, Jinsha Township (TW); Yu-Feng Chen, Hsinchu (TW); Chen-Shien Chen, Zhubei (TW); Mirng-Ji Lii, Sinpu Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 170 days.

(21) Appl. No.: 16/865,953

(22) Filed: May 4, 2020

(65) Prior Publication Data
US 2020/0266074 A1    Aug. 20, 2020

Related U.S. Application Data

(60) Continuation of application No. 15/583,708, filed on May 1, 2017, now Pat. No. 10,643,861, which is a
(Continued)

(51) Int. Cl.
*H01L 23/34* (2006.01)
*H01L 23/02* (2006.01)
(Continued)

(52) U.S. Cl.
CPC ........ *H01L 21/485* (2013.01); *H01L 21/4853* (2013.01); *H01L 21/563* (2013.01); *H01L 22/14* (2013.01); *H01L 23/3185* (2013.01); *H01L 23/49811* (2013.01); *H01L 23/49838* (2013.01); *H01L 23/5381* (2013.01); *H01L 23/5382* (2013.01); *H01L 23/5385* (2013.01); *H01L 24/02* (2013.01); *H01L 24/14* (2013.01); *H01L 24/16* (2013.01); *H01L 24/24* (2013.01); *H01L 24/32* (2013.01); *H01L 24/73* (2013.01); *H01L 24/81* (2013.01); *H01L 24/82* (2013.01);
(Continued)

(58) Field of Classification Search
CPC ... H01L 21/4853; H01L 21/563; H01L 22/14; H01L 23/3185; H01L 23/49811; H01L 23/49838; H01L 23/5381; H01L 23/5382; H01L 23/5385; H01L 24/02; H01L 24/14; H01L 24/16; H01L 24/24; H01L 24/32; H01L 24/73; H01L 24/81; H01L 24/82; H01L 24/85; H01L 24/92; H01L 25/0652; H01L 25/0655; H01L 25/18; H01L 25/50
USPC ............................ 438/15; 257/685–686, 723
See application file for complete search history.

(56) References Cited

U.S. PATENT DOCUMENTS 7,888,806 B2 *  2/2011  Lee ..................... H01L 23/5286
                                                 257/777
8,779,553 B2 *  7/2014  Rahman ............... H01L 23/562
                                                 257/618
(Continued)

*Primary Examiner* — Caleb E Henry
*Assistant Examiner* — Dilinh P Nguyen
(74) *Attorney, Agent, or Firm* — Slater Matsil, LLP

(57) ABSTRACT

A device is provided. The device includes a bridge layer over a first substrate. A first connector electrically connecting the bridge layer to the first substrate. A first die is coupled to the bridge layer and the first substrate, and a second die is coupled to the bridge layer.

20 Claims, 7 Drawing Sheets

Related U.S. Application Data division of application No. 14/588,715, filed on Jan. 2, 2015, now Pat. No. 9,640,521.

(60) Provisional application No. 62/057,812, filed on Sep. 30, 2014.

(51) Int. Cl.
*H01L 21/66* (2006.01)
*H01L 21/48* (2006.01)
*H01L 25/18* (2006.01)
*H01L 25/00* (2006.01)
*H01L 23/498* (2006.01)
*H01L 23/538* (2006.01)
*H01L 23/00* (2006.01)
*H01L 21/56* (2006.01)
*H01L 25/065* (2006.01)
*H01L 23/31* (2006.01)

(52) U.S. Cl.
CPC .............. *H01L 24/85* (2013.01); *H01L 24/92* (2013.01); *H01L 25/0652* (2013.01); *H01L 25/0655* (2013.01); *H01L 25/18* (2013.01); *H01L 25/50* (2013.01); *H01L 22/20* (2013.01); *H01L 24/03* (2013.01); *H01L 24/05* (2013.01); *H01L 24/06* (2013.01); *H01L 24/11* (2013.01); *H01L 24/13* (2013.01); *H01L 24/29* (2013.01); *H01L 24/33* (2013.01); *H01L 24/48* (2013.01); *H01L 24/83* (2013.01); *H01L 2224/023* (2013.01); *H01L 2224/0237* (2013.01); *H01L 2224/0239* (2013.01); *H01L 2224/02331* (2013.01); *H01L 2224/02375* (2013.01); *H01L 2224/03464* (2013.01); *H01L 2224/0401* (2013.01); *H01L 2224/04042* (2013.01); *H01L 2224/056* (2013.01); *H01L 2224/05111* (2013.01); *H01L 2224/05116* (2013.01); *H01L 2224/05139* (2013.01); *H01L 2224/05147* (2013.01); *H01L 2224/05155* (2013.01); *H01L 2224/05164* (2013.01); *H01L 2224/05554* (2013.01); *H01L 2224/05555* (2013.01); *H01L 2224/05611* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/06051* (2013.01); *H01L 2224/1132* (2013.01); *H01L 2224/1141* (2013.01); *H01L 2224/1145* (2013.01); *H01L 2224/11334* (2013.01); *H01L 2224/11444* (2013.01); *H01L 2224/11462* (2013.01); *H01L 2224/11849* (2013.01); *H01L 2224/131* (2013.01); *H01L 2224/133* (2013.01); *H01L 2224/13022* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13147* (2013.01); *H01L 2224/13155* (2013.01); *H01L 2224/13294* (2013.01); *H01L 2224/141* (2013.01); *H01L 2224/1403* (2013.01); *H01L 2224/16105* (2013.01); *H01L 2224/16106* (2013.01); *H01L 2224/16145* (2013.01); *H01L 2224/16227* (2013.01); *H01L 2224/2405* (2013.01); *H01L 2224/245* (2013.01); *H01L 2224/24105* (2013.01); *H01L 2224/24146* (2013.01); *H01L 2224/24147* (2013.01); *H01L 2224/24226* (2013.01); *H01L 2224/24227* (2013.01); *H01L 2224/293* (2013.01); *H01L 2224/2919* (2013.01); *H01L 2224/2929* (2013.01); *H01L 2224/29191* (2013.01); *H01L 2224/32106* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/48464* (2013.01); *H01L 2224/73204* (2013.01); *H01L 2224/73207* (2013.01); *H01L 2224/73209* (2013.01); *H01L 2224/73217* (2013.01); *H01L 2224/73253* (2013.01); *H01L 2224/73265* (2013.01); *H01L 2224/73267* (2013.01); *H01L 2224/814* (2013.01); *H01L 2224/81191* (2013.01); *H01L 2224/81411* (2013.01); *H01L 2224/81416* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81815* (2013.01); *H01L 2224/82105* (2013.01); *H01L 2224/82815* (2013.01); *H01L 2224/83101* (2013.01); *H01L 2224/83104* (2013.01); *H01L 2224/83862* (2013.01); *H01L 2224/83874* (2013.01); *H01L 2224/8592* (2013.01); *H01L 2224/92* (2013.01); *H01L 2224/9202* (2013.01); *H01L 2224/92125* (2013.01); *H01L 2224/92133* (2013.01); *H01L 2224/92144* (2013.01); *H01L 2224/92147* (2013.01); *H01L 2224/92163* (2013.01); *H01L 2224/92242* (2013.01); *H01L 2224/92244* (2013.01); *H01L 2224/92247* (2013.01); *H01L 2224/94* (2013.01); *H01L 2225/0651* (2013.01); *H01L 2225/06513* (2013.01); *H01L 2225/06517* (2013.01); *H01L 2225/06562* (2013.01); *H01L 2924/00014* (2013.01); *H01L 2924/10155* (2013.01); *H01L 2924/10156* (2013.01); *H01L 2924/1431* (2013.01); *H01L 2924/1434* (2013.01); *H01L 2924/1436* (2013.01); *H01L 2924/1437* (2013.01); *H01L 2924/15153* (2013.01); *H01L 2924/19107* (2013.01); *H01L 2924/3512* (2013.01)

(56) References Cited

U.S. PATENT DOCUMENTS

| | | |
|---|---|---|
| 2005/0045378 A1 | 3/2005 | Heng et al. |
| 2014/0063763 A1 | 3/2014 | Sato |
| 2014/0332966 A1 | 11/2014 | Xiu et al. |
| 2015/0235989 A1 | 8/2015 | Yu et al. |
| 2015/0364422 A1* | 12/2015 | Zhai .................. H01L 23/5385 |
| | | 257/773 |

* cited by examiner

MULTI-DIE PACKAGE WITH BRIDGE LAYER

PRIORITY CLAIM AND CROSS-REFERENCE

This application is a continuation of U.S. patent application Ser. No. 15/583,708, filed on May 1, 2017, entitled "Methods for Making Multi-Die Package with Bridge Layer," which is a divisional of U.S. patent application Ser. No. 14/588,715, filed on Jan. 2, 2015, entitled "Multi-Die Package with Bridge Layer and Method for Making the Same," now U.S. Pat. No. 9,640,521, issued May 2, 2017, which claims the benefit of U.S. Patent Provisional Application No. 62/057,812, filed on Sep. 30, 2014, entitled "Package and Method for Making the Same." Each of these applications is hereby incorporated herein by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been used. In a typical formation process of a 3D IC, two or more dies are bonded together and electrical connections are formed between each die and contact pads on a substrate. Another 3D package utilizes interposer techniques for bonding dies to an interposer to reduce form factor. 3D packages utilizing interposers, however, generally have higher costs. Additionally, these packages may not support certain die to die functionality, such as logic to memory die, for example.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
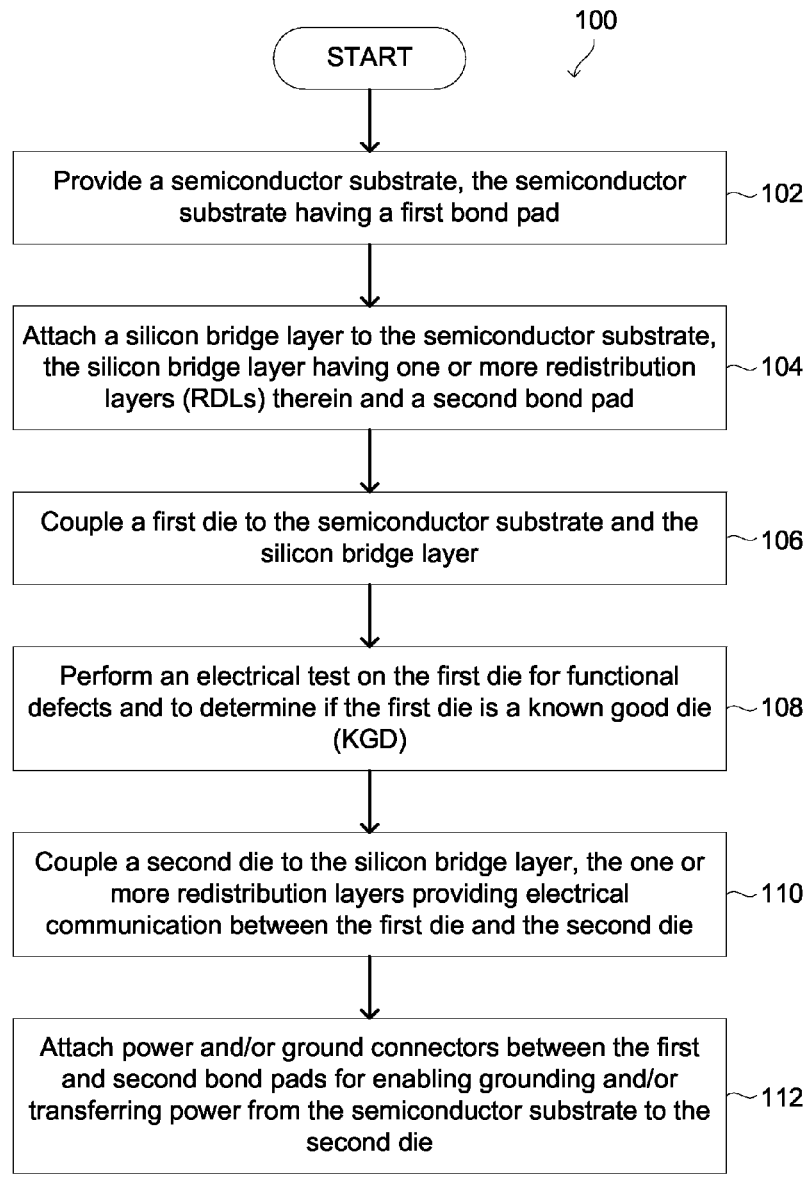
FIG. 1 is a flowchart of a method of fabricating a semiconductor device/package, according to one or more embodiments of the present disclosure.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and a method of forming the same are provided in accordance with various exemplary embodiments. The intermediate stages of forming the package are illustrated. The variations of the embodiments are discussed.

FIG. 1 is a flowchart of a method 100 of fabricating a semiconductor package according to various aspects of the present disclosure. Referring to FIG. 1, the method 100 includes block 102, in which a semiconductor substrate having a first bond pad is provided. The method 100 includes block 104, in which a silicon bridge layer is attached to the semiconductor substrate. The silicon bridge layer has one or more redistribution layers (RDLs) therein and a second bond pad. The method 100 includes block 106, in which a first die is coupled to the semiconductor substrate and the silicon bridge layer. The method 100 includes block 108, in which an electrical test is performed on the first die for functional defects and to determine if the first die is a known good die (KGD). The method 100 includes block 110, in which a second die is coupled to the silicon bridge layer. The one or more redistribution layers provide electrical communication between the first die and the second die. The method 100 includes block 112, in which power and/or ground connectors are attached between the first and second bond pads for enabling grounding and/or transferring power from the semiconductor substrate to the second die.

In some embodiments, additional processes are performed before, during, and/or after the blocks 102-112 shown in FIG. 1 to complete the fabrication of the semiconductor package, but these additional processes are not discussed herein in detail for the sake of brevity.

FIGS. 2, 4-8, and 11-15 are cross-sectional views of a semiconductor package at various fabrication stages according to one or more embodiments of the present disclosure. FIGS. 2-16 have been simplified for a better illustration of the concepts of the present disclosure. It should be appreciated that the materials, geometries, dimensions, structures, and process parameters described herein are only illustrative, and are not intended to be, and should not be construed to be, limiting to the present disclosure. Many alternatives and modifications will be apparent to those skilled in the art, once informed by the present disclosure.

Figure 2:
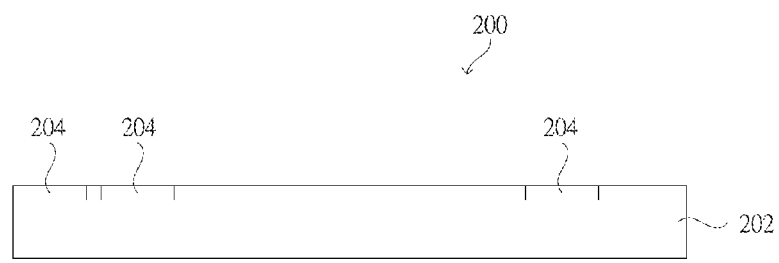
FIGS. 2, 4-8, and 11-15 are cross-sectional views of a portion of a semiconductor package at various stages of fabrication, according to one or more embodiments of the present disclosure.

FIG. 2 is a view of a package 200 showing a cross-sectional view of a portion of a substrate 202. In some embodiments, substrate 202 is a semiconductor substrate, which may further be a crystalline silicon substrate, although it may be formed of other semiconductor materials such as silicon germanium, silicon carbon, a III-V compound semiconductor, or the like. In alternative embodiments, substrate 202 is a dielectric substrate comprising, for example, silicon oxide. In other embodiments, substrate 202 is an organic substrate, a ceramic substrate, a silicon, a high density interconnect, a packaging substrate, or the like. In some embodiments, the substrate 202 may include electrical elements, such as capacitors, resistors, signal distribution circuitry, and/or the like. In some embodiments, these electrical elements may be active, passive, or a combination of active and passive elements. All such combinations are fully intended to be included within the scope of the embodiments.

In some embodiments, substrate 202 includes through vias (TVs) (not shown) that are used to provide electrical connections between various device components thereon. In some embodiments, substrate 202 includes redistribution lines (RDLs) (not shown) within and/or on one or both surfaces of the substrate 202 to allow for communication between various device components of package 200, and to allow for a variety of pin configurations as well as larger electrical connections.

FIG. 2 also shows connectors 204 formed on substrate 202 to provide electrical connectivity to various device components of package 200, according to one or more embodiments. In other embodiments, the connectors 204 are formed in or recessed in the substrate 202. Connectors 204 may be contact pads, and hence are alternatively referred to as contact pads 204 hereinafter. Contact pads 204 may comprise aluminum, copper, nickel, or combinations thereof. In other embodiments, connectors 204 may include under-bump metallurgies (UBMs) or the like.

Figure 4:
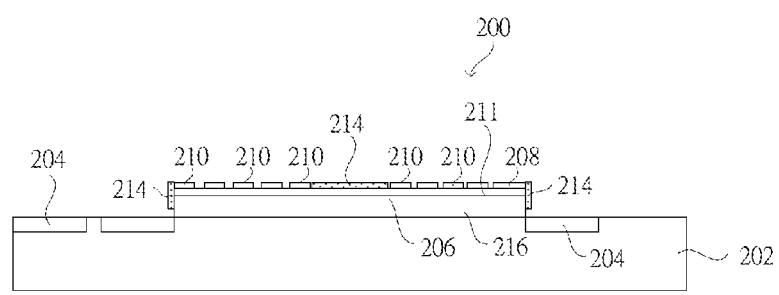

With reference now to FIG. 4, a bridge layer 206 is shown attached on substrate 202 by way of an adhesive layer 216, according to one or more embodiments. In some embodiments, according to some design requirements the substrate 202 can have a recessed portion to house the adhesive layer 216 and the bridge layer 206 therein. Adhesive layer 216 may comprise a die attachment film (DAF), an epoxy, a glue, or the like. In some embodiments, the bridge layer 206 functions to provide electrical communication between two or more dies bonded thereon. In some embodiments, the bridge layer 206 is a silicon bridge, and hence is alternatively referred to as silicon bridge 206 hereinafter. In some embodiments, the silicon bridge 206 includes one or more redistribution layers (RDLs) 211 and a plurality of connectors 210 connected to the one or more RDLs 211. The RDLs 211 provide electrical communication between the first die 220 and the second die 226 and provide contacts and fan-out regions. The redistribution layers 211 may include metal lines formed of a metal such as copper, aluminum, tungsten, or titanium distributed in a plurality of layers, and vias interconnecting the metal lines of different layers. The one or more redistribution layers may be formed using common methods for forming interconnect lines in integrated circuits.

The silicon bridge 206 may be free from active devices (such as transistors) and passive devices (such as inductors, resistors, and capacitors) in accordance with some embodiments. In alternative embodiments, silicon bridge 206 includes passive devices, but does not include active devices. In yet alternative embodiments, silicon bridge 206 includes both active devices and passive devices therein. Silicon bridge 206 does not include through substrate vias (TSVs) or through silicon vias therein, in some embodiments.

FIGS. 3a-3d show the silicon bridge 206 at various stages of fabrication according to one or more embodiments of the present disclosure. Shown in FIG. 3a, one or more contact pads 208 and one or more connectors 210 are formed on silicon bridge 206. Contact pads 208 are formed over conductive vias (not shown) in the silicon bridge 206 to establish connection with the RDLs 211 (shown in FIG. 4) in the silicon bridge 206, according to some embodiments. In some embodiments, the contact pads 208 are directly connected to the RDLs 211 (shown in FIG. 4) in the silicon bridge 206. In later fabrication steps, power and/or ground connectors (e.g., solder balls, bond wires) are coupled to the contact pads 208 for transferring power and/or for enabling grounding from the substrate 202 to second die 226 (see FIG. 8 or 15). Connectors 210 provide the connection points for coupling one or more dies to the silicon bridge 206. Contact pads 208 may comprise copper, aluminum, nickel, nickel, or combinations thereof. Connectors 210 are contact pads, in one embodiment. In other embodiments, connectors 210 are external contacts, such as a copper layer, a nickel layer, a lead free (LF) layer, an electroless nickel electroless palladium immersion gold (ENEPIG) layer, a Cu/LF layer, a Sn/Ag layer, a Sn/Pb layer, combinations of these, or the like, and these may alternatively be utilized. Any suitable external connector, and any suitable process for forming the external connectors, may be utilized for connectors 210, and all such external connectors are fully intended to be included within the scope of the embodiments.

Figure 3A:
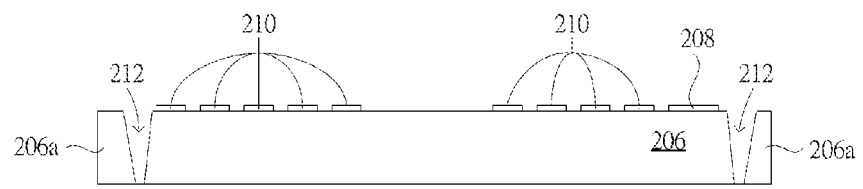
FIGS. 3a-3d are sequential views of a bridge layer at various stages of fabrication, according to one or more embodiments of the present disclosure.

With reference still to FIG. 3a, one or more trenches 212 are formed in silicon bridge 206. In some embodiments, trenches 212 are formed prior to the formation of an isolation layer above the silicon bridge 206. The isolation layer insulates or encapsulates the silicon bridge 206 to avoid shorts or solder bridging that can occur when power and/or ground connectors (e.g., solder balls) are attached at a side or at a corner of the silicon bridge 206 (see FIGS. 5-8). Trenches 212 are formed in silicon bridge 206 by patterning the silicon bridge 206, in accordance with one or more embodiments of the present disclosure. The trenches 212 may be formed through, for example, laser grooving, etching, or the like.

Figure 3B:
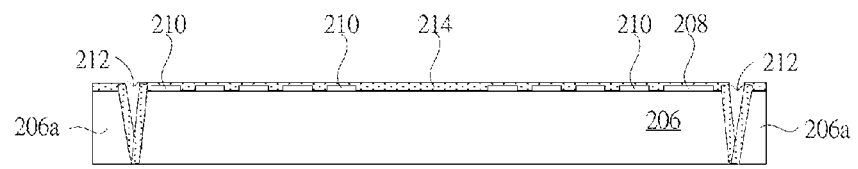
Figure 3C:
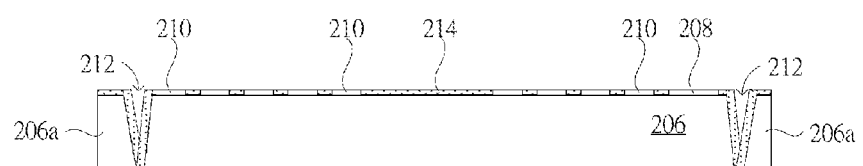
Figure 3D:
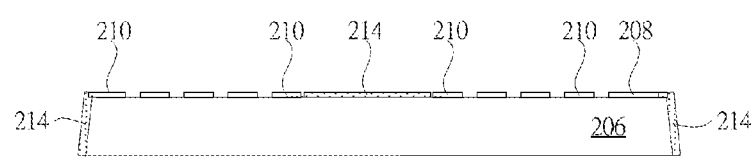

With reference now to FIG. 3b, an isolation layer 214 is deposited on a surface of the silicon bridge 206. The isolation layer 214 covers the one or more connectors 210, the one or more contact pads 208, and fills the trenches 212. The isolation layer electrically isolates the silicon bridge 206 and may comprise a polyimide, molding compound, epoxy, MUF material, or the like and may be formed by a spin coating process, for example. Any suitable isolation material and any suitable process for forming the isolation layer 214 are fully intended to be included within the scope of the embodiments. As shown in FIG. 3c, the silicon bridge 206 goes through a lithography process to open connectors 210 and contact pads 208. Portions 206a of silicon bridge 206 are thereafter removed to expose the sides of the silicon bridge 206 covered by isolation layer 214. The isolation layer 214 covers the sides and portions of a surface of the silicon bridge 206 to prevent short circuitry that may occur when a power and/or ground connector, such as a solder ball is connected between a contact pad on substrate 202 and a contact pad on the silicon bridge 206. In some embodiments, silicon bridge 206 undergoes a thinning process, such as by chemical mechanical planarization (CMP). In some embodiments, as shown in FIG. 3d portions of the isolation layer 214 remaining on a surface of the silicon bridge 206 are removed by suitable etching processes known in the art. It should be understood that the ordering of the various steps discussed above are provided for illustrative purposes, and as such, other embodiments may utilize different sequences. These various ordering of steps are to be included within the scope of embodiments.

Figure 5:
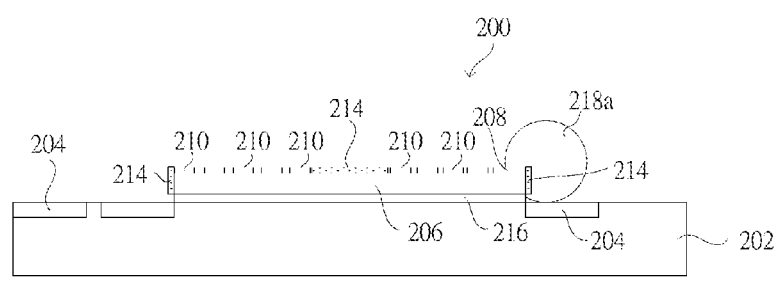

FIG. 5 illustrates the formation of connectors 218a electrically connected between a contact pad 204 on substrate 202 and a contact pad 208 on silicon bridge 206, according to one or more embodiments. Connectors 218a provide power, ground, and/or signal connectivity between the substrate 202 and the silicon bridge 206 for transferring power from the substrate 202 to a second die 226 and/or for enabling grounding (see FIG. 8).

Figure 6:
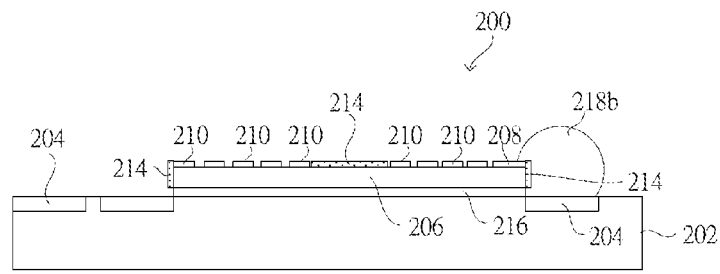

Connector 218a may include a conductive material such as a solder bump, solder ball, a conductive bump, a conductive paste, or the like and may be formed by lead free solder, eutectic lead, or the like. According to an exemplary embodiment, the connector 218a is a solder bump that is formed by placing a preformed solder sphere onto the contact pad 204 and then reflowing the solder sphere. The solder bump may include a lead free pre-solder layer, SnAg, or a solder material including alloys of tin, lead, silver, copper, nickel, bismuth, or combinations thereof. By exposing the package 200 to a temperature sufficiently high to reflow the solder sphere, the solder sphere melts allowing it to wet and adhere to the contact pad 204 and forming a desired bump configuration, as shown in FIG. 6. Upon reflow, the solder sphere forms into connector 218b (e.g., a solder bump). The particular reflow temperatures will depend largely on the particular alloy composition of the solder spheres. Reflow processes for solder spheres of various alloy compositions are well-known in the art and need not be described here. As seen from FIGS. 5 and 6, although the connector 218a (providing power and/or ground connectivity) contacts silicon bridge 206 at a side or a corner thereof, short circuitry of package 200 is avoided because of the isolation layer 214. The isolation layer 214 insulates or encapsulates the silicon bridge 206 to avoid shorts that may otherwise occur when the connector 218a makes contact with a conductive layer or conductive component in the silicon bridge 206.

Figure 7:
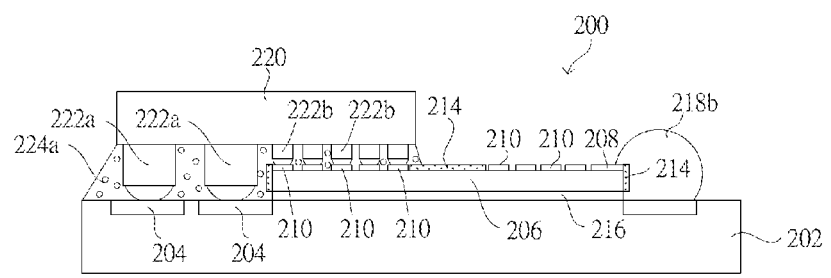

With reference now to FIG. 7, there is illustrated a first die 220 attached to the substrate 202 and the silicon bridge 206, according to one or more embodiments. First die 220 may be a logic die in some embodiments, although first die 220 may also be a memory die. In some embodiments, first die 220 is a Dynamic Random Access Memory (DRAM) die, Static Random Access Memory (SRAM) die, hybrid memory (HBM) cube die, combinations of these, or the like. First die 220 is electrically coupled to the substrate 202 by a plurality of electrical connectors 222a and to the silicon bridge 206 by a plurality of electrical connectors 222b, according to one or more embodiments. Electrical connectors 222a provide power, ground, and/or signals from substrate 202 to first die 202. Electrical connectors 222a may be metal pillars that are electrically coupled to the contact pads 204 on substrate 202, in some embodiments. These metal pillars may comprise copper, and hence are alternatively referred to as copper pillars. Other conductive materials such as nickel and/or aluminum may also be used in the metal pillars. However, as one of ordinary skill in the art will understand, while the electrical connectors 222a have been described above as metal or copper pillars, these are merely intended to be illustrative and are not intended to limit the embodiments. Rather, any suitable type of connectors, such as controlled collapse chip connection (C4) bumps, copper layers, nickel layers, lead free (LF) layers, copper posts, solder caps, electroless nickel electroless palladium immersion gold (ENEPIG) layers, Cu/LF layers, Sn/Ag layers, Sn/Pb layers, combinations of these, or the like, may alternatively be utilized. Any suitable electrical connector, and any suitable process for forming the connectors, may be utilized, and all such connectors are fully intended to be included within the scope of the embodiments.

In an embodiment, electrical connectors 222b are micro-bumps such as copper pillars or copper posts for fine pitch connection and may comprise a material such as copper or other suitable materials. In some embodiments, the copper pillars for fine pitch connection has a pitch of 40 μm. In other embodiments, the electrical connectors 222b are tin solder bumps and may be formed by initially forming a layer of tin through any suitable method such as evaporation, electroplating, printing, solder transfer, ball placement, or the like. Once a layer of tin has been formed on the silicon bridge 206, a reflow is performed in order to shape the material into the desired solder bump shape with a diameter of about, e.g., 20 μm, although any suitable size may alternatively be utilized.

Though the electrical connectors 222b have been described above as micro-bumps including copper pillars and copper posts, one of ordinary skill in the art will recognize that these are merely intended to be illustrative and are not intended to limit the embodiments. Rather, any suitable type of connectors, such as solder caps, solder balls, combinations of these, or the like, may alternatively be utilized.

As discussed above, through vias (TVs)(not shown), which are conductive vias, are formed in substrate 202 and are electrically coupled to electrical connectors 222a and 222b through metal pads 204 and connectors 210, respectively.

Still referring to FIG. 7, a first underfill 224a may be injected or otherwise formed in the space between the first die 220, the silicon bridge 206, and the substrate 202, according to one or more embodiments. The first underfill 224a may, for example, comprise a liquid epoxy that is dispensed between the first die 220, the silicon bridge 206, and the substrate 202, and then cured to harden. The curing may be a thermal curing, a Ultra-Violet (UV) curing, or the like. The underfill is used, among other things, to reduce cracking in bonding structures such as for example, the solder layer between connectors, wherein cracks are typically caused by thermal stress and/or differences in the coefficient of thermal expansion (CTE) of the various components in the package 200.

Alternatively, either a deformable gel or silicon rubber could be formed between the first die 220, the silicon bridge 206, and the substrate 202 in order to help prevent cracks from occurring within the electrical connectors 222a and 222b. This gel or silicon rubber may be formed by injecting or otherwise placing the gel or rubber between the first die 220, the silicon bridge 206, and the substrate 202. The deformable gel or silicon rubber may also provide stress relief during subsequent processing. After the underfill is formed, in some embodiments, the first die 220 is subject to an electrical test to determine whether the die is a known good die (KGD) before a second die is attached onto the package 200. In some embodiments, the first die 220 is hooked up to a testing equipment such as a wafer prober and tested for functional defects by applying test patterns to the die. When all test patterns pass for first die 220, then the die is a known good die and additional dies may then be attached to the substrate 202.

Figure 8:
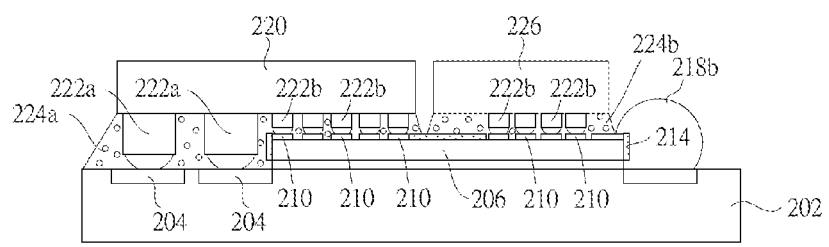

With reference now to FIG. 8, there is illustrated a second die 226 attached to the silicon bridge 206, according to one or more embodiments. Second die 226 may be a memory die in some embodiments, although second die 226 may also be a logic die. In some embodiments, second die 226 is a hybrid memory (HBM) cube die, Dynamic Random Access Memory (DRAM) die, Static Random Access Memory (SRAM) die, combinations of these, or the like. Additionally, while first die 220 and second die 226 may be different types of dies (e.g., the first die 220 may be a logic die and the second die 226 may be a DRAM die), they may alternatively be the same type of dies (e.g., both be DRAM dies). The first die 220 and the second die 226 may also comprise a stack of multiple dies in some embodiments. Any suitable combination of semiconductor dies, and any number of semiconductor dies, may alternatively be utilized, and all such numbers, combinations, and functionalities are fully intended to be included within the scope of the embodiments.

Second die 226 is electrically coupled to the connectors 210 on the silicon bridge 206 by a plurality of electrical connectors 222b, in some embodiments. In an embodiment, electrical connectors 222b are micro-bumps such as copper pillars or copper posts for fine pitch connection and may comprise a material such as copper or other suitable materials. In some embodiments, the copper pillars for fine pitch connection has a pitch of 40 µm. Though the electrical connectors 222b have been described above as copper pillars or copper posts, one of ordinary skill in the art will recognize that these are merely intended to be illustrative and are not intended to limit the embodiments. Rather, any suitable type of connectors, such as solder caps, solder balls, combinations of these, or the like, may alternatively be utilized.

In the embodiment where the second die 226 is a memory die, power and/or ground is transferred to second die 226 from substrate 202 by way of connector 218b (e.g., solder bump).

Still referring to FIG. 8, according to some embodiments a second underfill 224b is injected or otherwise formed in the space between the second die 226 and the silicon bridge 206. The second underfill 224b may, for example, comprise a liquid epoxy, deformable gel, silicon rubber, or the like, that is dispensed between the second die 226 and the silicon bridge 206, and then cured to harden. The curing may be a thermal curing, a Ultra-Violet (UV) curing, or the like. The underfill is used, among other things, to reduce cracking in bonding structures such as for example, the solder layer between connectors, wherein cracks are typically caused by thermal stress and/or differences in the coefficient of thermal expansion (CTE) of the various components in the package 200.

Figure 9:
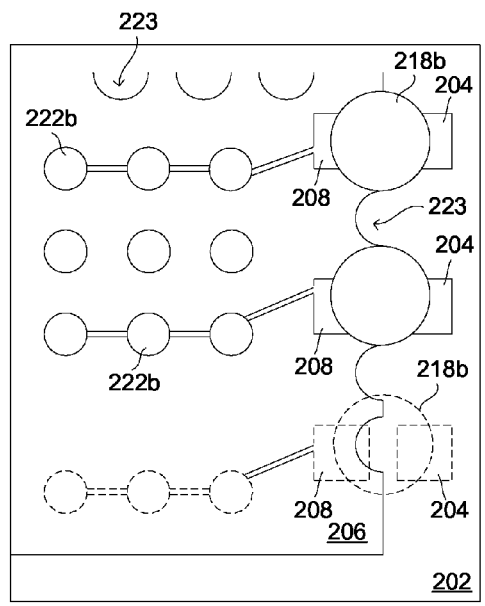
FIG. 9 is a top view of a portion of the package shown in FIG. 8, according to one or more embodiments of the present disclosure.

FIG. 9 is a top view of a portion of the package shown in FIG. 8, according to one or more embodiments of the present disclosure. FIG. 9 illustrates connectors 218b making contact between a contact pad 204 on substrate 202 and a contact pad 208 on silicon bridge 206. Connector 218b (in dashed lines) clearly shows connector 218b contacting contact pad 204 (in dashed lines) on substrate 202 and contact pad 208 (in dashed lines) on silicon bridge 206. Also, the semi-circular edge profile 223 of the bridge layer 206 accommodates insertion of a solder ball or connector 218b to the bridge layer.

Figure 10:
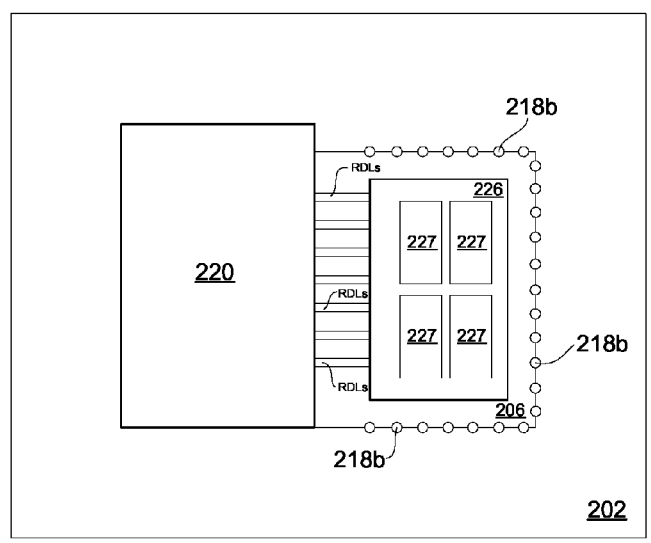
FIG. 10 is a top down view of the package shown in FIG. 8, according to one or more embodiments of the present disclosure.

FIG. 10 is a top down view of the package shown in FIG. 8, according to one or more embodiments of the present disclosure. Note that connectors 218b provide power, ground, and/or signal connectivity between the substrate 202 and the silicon bridge 206 for transferring power from the substrate to the second die 226. The redistribution layers (RDLs) 211 (shown FIG. 4) provide signal connectivity between first die 220 and second die 226. Note also that in the embodiment depicted in FIG. 10, second die 226 is a memory die, such as a hybrid memory (HBM) cube die having a plurality of blocks 227, wherein each of the blocks 227 contains a plurality of micro-bumps for signal connectivity between the memory die and first die 220. In some embodiments, each of blocks 227 contains 6×73 micro-bumps, at 40 µm pitch.

The package 200 shown in FIGS. 2 and 4-8 are only for illustrative purpose and are not limiting. Additional steps may be performed such as forming a printed circuit board (PCB) below substrate 202. Also, it should be understood that the ordering of the various steps discussed above with reference to FIGS. 2 and 4-8 are provided for illustrative purposes, and as such, other embodiments may utilize different sequences. For example, the underfill material may be formed in the package 200 after both first and second dies 220 and 226 have been bonded to silicon bridge 206 and/or substrate 202. These various ordering of steps are to be included within the scope of embodiments. Additional embodiments can also be conceived.

FIGS. 11 through 15 illustrate cross-sectional views of intermediate stages in the formation of a package in accordance with alternative embodiments of the present disclosure. Unless specified otherwise, the materials and the formation methods of the components in these embodiments are essentially the same as the like components, which are denoted by like reference numerals with respect to the embodiments shown in FIGS. 2 through 8. The details regarding the formation process and the materials of the components shown in FIGS. 11 through 15 may thus be found in the discussion of the embodiments shown in FIGS. 2 through 8.

Figure 11:
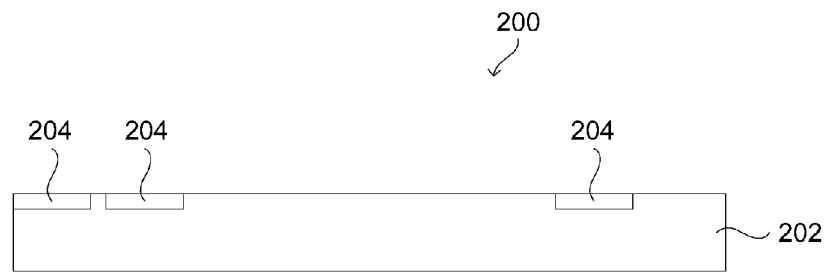
Figure 12:
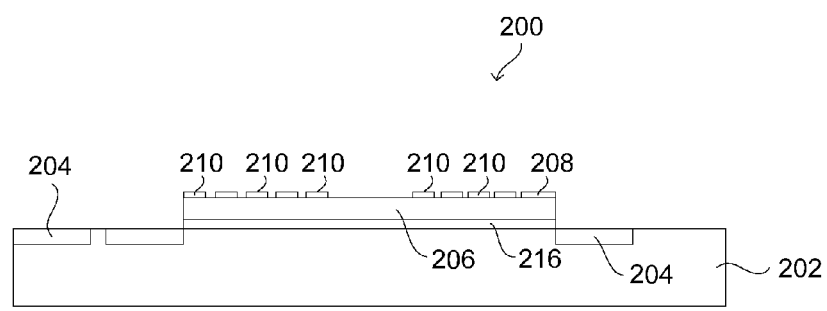

FIG. 11 is a view of a package 200 showing a cross-sectional view of a portion of a substrate 202 having connectors 204 formed thereon. Substrate 202 is essentially the same as shown in FIG. 2, and hence the details of substrate 202 are not repeated herein. Next, referring to FIG. 12, a silicon bridge 206 is shown attached to substrate 202 by way of an adhesive layer 216, such as, for example a die attachment film (DAF), according to one embodiment. Silicon bridge 206 is essentially the same as shown in FIG. 4, and hence the details of silicon bridge 206 are not repeated herein. However, in these embodiments an isolation layer is not formed over the silicon bridge 206. As the power and/or ground connectors implement bond wires (see FIG. 13) instead of some other connectors, such as solder balls or solder bumps, the silicon bridge 206 need not be encapsulated with an isolation layer in order to avoid shorts or solder bridging that can occur.

Figure 13:
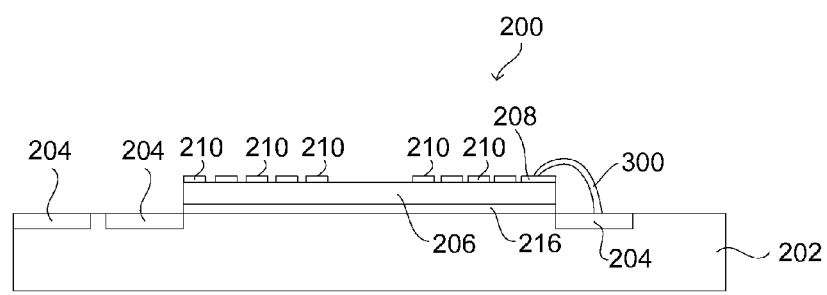

FIG. 13 illustrates connectors 300 electrically connected between a contact pad 204 on substrate 202 and a contact pad 208 on silicon bridge 206. In these embodiments, the connectors 300 are bond wires, and hence are alternatively referred to as bond wires 300 hereinafter. Bond wires 300 provide power and/or ground connectivity between the substrate 202 and the silicon bridge 206 for transferring power from the substrate 202 to a second die 226, such as memory die (see FIG. 15), according to one or more embodiments. As discussed above, an isolation layer is not needed to isolate silicon bridge 206 as bond wires 300 do not make physical contact with silicon bridge 206 at a side or corner thereof.

Figure 14:
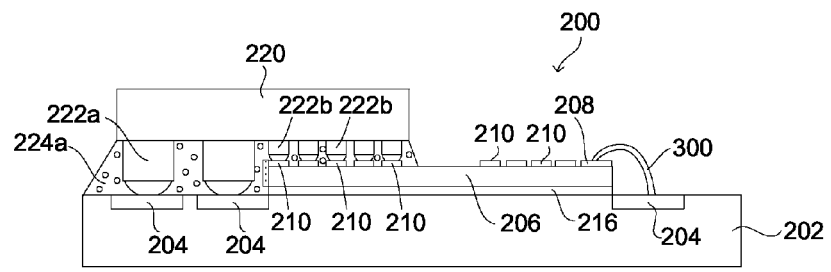

With reference now to FIG. 14, there is illustrated a first die 220 attached to the substrate 202 and the silicon bridge 206, according to one or more embodiments. First die 202 may be a logic die in some embodiments, although in other embodiments first die 202 may be a memory die. Again, first die 220 is electrically coupled to the substrate 202 by a plurality of electrical connectors 222a and to the silicon bridge 206 by a plurality of electrical connectors 222b, according to some embodiments. Electrical connectors 222a provide power and/or ground signals from substrate 202 to first die 202. Electrical connectors 222a may be metal pillars, copper pillars, solder bumps, or collapse chip connection (C4) bumps in some embodiments. Any suitable electrical connector, and any suitable process for forming the connectors, may be utilized, and all such connectors are fully intended to be included within the scope of the embodiments.

In some embodiments, electrical connectors 222b are contact bumps such as micro-bumps for fine pitch connection. Again, a first underfill 224 may be injected or otherwise formed in the space between the first die 220, the silicon bridge 206, and the substrate 202. The underfill may comprise a liquid epoxy, deformable gel, silicon rubber, or the like. In some embodiments the package 200 may thereafter undergo an electrical testing step to verify the functionality of some components of package 200 such as, for example the first die 220.

Figure 15:
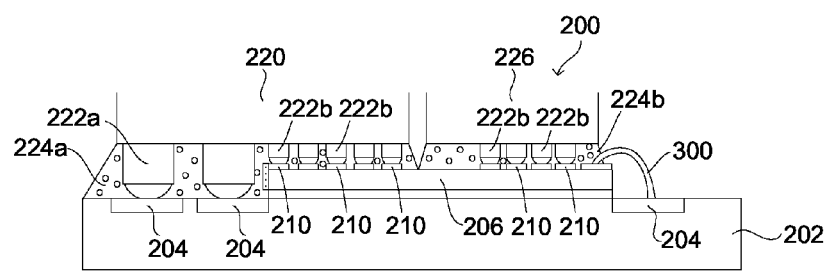

In FIG. 15, there is illustrated a second die 226 attached to the silicon bridge 206, in some embodiments. Second die may be a memory die in some embodiments, although second die 226 may also be a logic die. While first die 220 and second die 226 may be different types of dies (e.g., first die 220 is a logic die and second die 226 is a memory die), they may alternatively be the same type of dies (e.g., both be DRAM dies or both be logic dies). The first die 220 and the second die 226 may also comprise a stack of multiple dies in some embodiments. Any suitable combination of semiconductor dies, and any number of semiconductor dies, may alternatively be utilized, and all such numbers, combinations, and functionalities are fully intended to be included within the scope of the embodiments.

Figure 16:
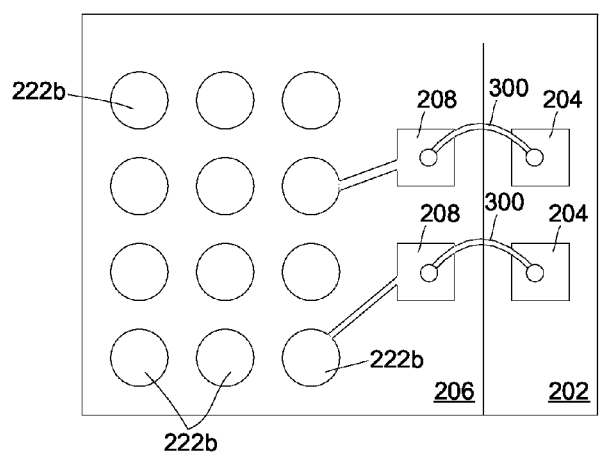
FIG. 16 is a top view of a portion of the package shown in FIG. 15, according to one or more embodiments of the present disclosure.

Again, second die 226 is electrically coupled to the silicon bridge 206 by a plurality of electrical connectors 222b (e.g., micro-bumps), in some embodiments. In some embodiments, a second underfill 224b is injected or otherwise formed in the space between the second die 226 and the silicon bridge 206 and may comprise a liquid epoxy, a deformable gel, a silicon rubber, or the like. FIG. 16 is a top view of a portion of the package 200 shown in FIG. 15, according to one or more embodiments of the present disclosure.

The package 200 shown in FIGS. 11-16 are only for illustrative purpose and are not limiting. Additional steps may be performed such as forming a printed circuit board (PCB) below substrate 202. Also, it should be understood that the ordering of the various steps discussed above with reference to FIGS. 11-16 are provided for illustrative purposes, and as such, other embodiments may utilize different sequences. For example, the underfill material may be formed in the package 200 after both first and second dies 220 and 226 have been bonded to silicon bridge 206 and/or substrate 202. These various ordering of steps are to be included within the scope of embodiments. Additional embodiments can also be conceived.

It should be understood that the above disclosure provides a general description of embodiments and that embodiments may include numerous other features. For example, embodiments of the package 200 may include under bump metallization layers, passivation layers, molding compounds, additional dies and/or substrates, and the like. Additionally, the structure, placement and positioning of the first die 220, the second die 226, and the silicon bridge 206 are provided for illustrative purposes, and accordingly, other embodiments can be conceived and may utilize different structures, placements, materials, and positions.

One or more embodiments of the package structure of the present disclosure may include one or more of the following advantages over other 3D IC packages. Unlike other package structures that may support logic to logic die communication but not logic to memory die communication, one or more embodiments of the present disclosure supports logic to memory die communication. Also, one or more embodiments of the present disclosure have lower costs associated with their manufacture. Interposers used in 3D packages are generally more complicated in their layout and composition and so have higher manufacturing costs than the simpler redistribution layers (RDLs) found in silicon bridges. Additionally, one or more embodiments of the package structure saves manufacturing costs and time by first making sure a first die is a known good die (KGD) when it passes an electrical test for functional defects before a second die is attached onto a package substrate.

Various aspects of the present disclosure have been described. According to one aspect of this description, a package includes a substrate having a first bond pad layer. A silicon bridge layer having one or more redistribution layers therein. The silicon bridge layer has a second bond pad, and the silicon bridge layer is attached to the substrate by an adhesive layer. A first die is coupled to the substrate and the silicon bridge layer. A second die is coupled to the silicon bridge layer, wherein the first die and the second die communicate with one another by way of the one or more redistribution layers. Power and/or ground connectors are coupled to the first bond pad and the second bond pad for enabling grounding and/or transferring power from the semiconductor substrate to the second die.

According to another aspect of this description, a package includes a substrate having at least one first bond pad thereon. A silicon bridge layer having one or more redistribution layers disposed therein and the silicon bridge layer is attached to the substrate. The silicon bridge layer has at least one second bond pad thereon and a layer of protective coating on a surface thereof but exposing the at least one second bond pad. A first chip is coupled to the semiconductor substrate by a plurality of conductive pillars and to the bridge layer by a first plurality of conductive bumps. A second chip is coupled to the silicon bridge layer by a second plurality of conductive bumps, the second chip communicating with the first chip by way of the one or more redistribution layers. Power and/or ground connectors are connected between the at least one first bond pad and the at least one second bond pad for enabling grounding and/or transferring power from the semiconductor substrate to the second chip. A first underfill is disposed between the first chip and a portion of the semiconductor substrate and between the first chip and a first portion of the silicon bridge layer, and a second underfill disposed between the second chip and a second portion of the silicon bridge layer, opposite the first portion of the silicon bridge layer.

According to yet another aspect of this description, a method for forming a package structure includes providing a semiconductor substrate having a first bond pad. A silicon bridge layer is attached to the semiconductor substrate, the silicon bridge layer having one or more redistribution layers (RDLs) therein and a second bond pad. A first die is coupled to the substrate and the silicon bridge layer. An electrical test is performed on the first die for functional defects and to determine if the first die is a known good die (KGD). A second die is coupled to the silicon bridge layer, the one or more redistribution layers providing electrical communication between the first die and the second die. Power and/or ground connectors are attached between the first and second bond pads for enabling grounding and/or transferring power from the semiconductor substrate to the second die.

In the preceding detailed description, various embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims and their range of equivalents.

What is claimed is:

1. A device, comprising:
a first substrate comprising a plurality of first contacts extending along a first surface of the first substrate;
a bridge overlying the first substrate, the bridge comprising a plurality of second contacts extending along a second surface of the bridge, second contacts of the plurality of second contacts being positioned along one or more edges of the second surface of the bridge, and the second surface of the bridge facing away from the first surface of the first substrate;
a plurality of electrical connectors, wherein the plurality of electrical connectors electrically connect the plurality of second contacts to the plurality of first contacts, and each of the plurality of electrical connectors extends along a sidewall of the bridge, wherein each of the plurality of electrical connectors being directly coupled to a respective second contact of the plurality of second contacts and directly coupled to a respective first contact of the plurality of first contacts;
a first die overlying the bridge, wherein a perimeter of the first die is within a perimeter of the bridge in a plan view; and
a second die overlying the, wherein the second die partially overlaps the bridge and extends beyond the bridge in the plan view.

2. The device according to claim 1, wherein the first die comprises a plurality of blocks, and each of the plurality of blocks comprises a respective plurality of third contacts.

3. The device according to claim 2, wherein the second die is connected to the respective plurality of third contacts of each of the plurality of blocks of the first die by a plurality of redistribution layers of the bridge.

4. The device according to claim 1, wherein each of the plurality of electrical connectors is a conductive bump that contacts the sidewall of the bridge.

5. The device according to claim 4, wherein a height of the plurality of electrical connectors over the first substrate is higher than a height of the bridge over the first substrate.

6. The device according to claim 1, wherein each of the plurality of electrical connectors is a bond wire.

7. The device according to claim 1, wherein the plurality of electrical connectors are positioned along at least three edges of the bridge.

8. The device according to claim 1, wherein a length of the first die in the plan view is less than a length of the second die.

9. The device according to claim 1, wherein the second die is connected to the bridge and connected to the first substrate.

10. A device, comprising:
a first substrate;
a plurality of first contacts extending along a first surface of the first substrate;
a second substrate disposed on the first surface of the first substrate, wherein a plurality of second contacts are disposed on a first surface of the second substrate, and in a plan view the plurality of first contacts are positioned outside of and along a perimeter of the second substrate, wherein the second substrate is physically connected to the first substrate by an adhesive interposed between the first surface of the first substrate and a second surface of the second substrate facing the first substrate;
a plurality of electrical connectors extending between the plurality of first contacts and the plurality of second contacts;
a third substrate over the second substrate; and
a fourth substrate over the second substrate next to the third substrate, wherein the fourth substrate overlies a sidewall of the second substrate, the fourth substrate is electrically connected to the third substrate by the second substrate, and the fourth substrate is electrically connected to the first substrate.

11. The device according to claim 10, wherein electrical connectors of the plurality of electrical connectors extend along at least three sidewalls of the second substrate.

12. The device according to claim 10, wherein the third substrate is a memory die comprising a plurality of blocks.

13. The device according to claim 10, wherein the fourth substrate is electrically connected to the third substrate by a redistribution structure comprised in the second substrate.

14. The device according to claim 10, further comprising an underfill interposed between the second substrate and the third substrate.

15. A device, comprising:
a semiconductor substrate;
a plurality of first contact pads extending along a surface of the semiconductor substrate;
a bridge attached to the semiconductor substrate, wherein a first sidewall of the bridge is parallel to a second sidewall of the bridge, and a third sidewall of the bridge is orthogonal to the first sidewall of the bridge;

a plurality of second contact pads extending along a surface of the bridge that faces away from the semiconductor substrate, the plurality of second contact pads being positioned along a perimeter of the bridge;

a plurality of electrical connectors, each of the plurality of electrical connectors physically contacting corresponding ones of the plurality of first contact pads and the plurality of second contact pads, wherein electrical connectors of the plurality of electrical connectors are power connectors or ground connectors;

a first die over the bridge; and a second die, the second die being attached to the bridge and to the semiconductor substrate.

16. The device according to claim 15, wherein the plurality of first contact pads are positioned outside of a perimeter of the bridge in a plan view.

17. The device according to claim 15, wherein electrical connectors of the plurality of electrical connectors are bumps, and an insulating layer is disposed on the first sidewall of the bridge, the second sidewall of the bridge, and the third sidewall of the bridge.

18. The device according to claim 15, wherein electrical connectors of the plurality of electrical connectors are bond wires.

19. The device according to claim 15, wherein the bridge is free of active devices.

20. The device according to claim 15, wherein a perimeter of the first die is within a perimeter of the bridge in a plan view.

* * * * *